(12) United States Patent
Tung et al.

(10) Patent No.: US 11,222,677 B1
(45) Date of Patent: Jan. 11, 2022

(54) MAGNETORESISTIVE RANDOM ACCESS MEMORY AND OPERATING METHOD THEREOF

(71) Applicant: NS POLES TECHNOLOGY CORP., Zhuhai (CN)

(72) Inventors: Ming Sheng Tung, Hsinchu (TW); Wen Chin Lin, Zhubei (TW)

(73) Assignee: NS Poles Technology Corp., Zhuhai (CN)

( * ) Notice: Subject to any disclaimer, the term of this patent is extended or adjusted under 35 U.S.C. 154(b) by 0 days.

(21) Appl. No.: 17/023,599

(22) Filed: Sep. 17, 2020

(30) Foreign Application Priority Data

Jul. 13, 2020 (TW) ................................ 109123583

(51) Int. Cl.
*G11C 11/16* (2006.01)
*G11C 11/4091* (2006.01)

(52) U.S. Cl.
CPC ...... *G11C 11/1655* (2013.01); *G11C 11/1673* (2013.01); *G11C 11/1675* (2013.01); *G11C 11/4091* (2013.01)

(58) Field of Classification Search
CPC .................................................. G11C 11/1655
USPC .......................................................... 365/158
See application file for complete search history.

(56) References Cited

U.S. PATENT DOCUMENTS

2011/0228594 A1* 9/2011 Rao ..................... G11C 11/1673
365/158
2018/0122466 A1* 5/2018 Terada ................ G11C 13/0026

OTHER PUBLICATIONS

Office Action and Examination Report for counterpart Taiwanese Application No. 109123583, dated Dec. 22, 2020.

* cited by examiner

*Primary Examiner* — Min Huang
(74) *Attorney, Agent, or Firm* — Rosenberg, Klein & Lee

(57) ABSTRACT

A magnetoresistive random access memory (MRAM) includes a plurality of input/output units. Each input/output units can read and write memory cells simultaneously. So a read/write column to column delay time (tCCD) of the MRAM is equal to or shorter than a read/write column to column delay time of a dynamic random access memory (DRAM). Consequently, a data-rate of the MRAM is equal to or shorter than a data-rate of the DRAM.

5 Claims, 6 Drawing Sheets

US 11,222,677 B1

MAGNETORESISTIVE RANDOM ACCESS MEMORY AND OPERATING METHOD THEREOF

This application claims priority for Taiwan patent application no. 109123583 filed on 13 Jul. 2020, the content of which is incorporated by reference in its entirely.

BACKGROUND OF THE INVENTION

Field of the Invention

The present invention relates to a magnetoresistive random access memory (MRAM), particularly to a MRAM whose read/write column to column delay time (tCCD) is equal to or shorter than tCCD of a dynamic random access memory (DRAM), and an operating method thereof.

Description of the Prior Arts

FIG. 1 and FIG. 2 show the writing operations of a memory cell of a conventional MRAM. In FIG. 1, a high writing voltage VH and a low writing voltage VL are respectively applied to a bit line BL and a source line SL of a memory cell 10. While a transistor M1 is turned on, it indicates that the memory cell 10 is selected for a writing operation. Thus, a current I1 flows from the bit line BL through the memory cell 10 to the source line SL, which causes the memory cell 10 to have a first resistance. The first resistance indicates that a parallel data "P" is written into the memory cell 10. In FIG. 2, a low writing voltage VL and a high writing voltage VH are respectively applied to the bit line BL and the source line SL of the memory cell 10. While the transistor M1 is turned on, it indicates that the memory cell 10 is selected for a writing operation. Thus, a current I1 flows from the source line SL through the memory cell 10 to the bit line BL, which causes the memory cell 10 to have a second resistance. The second resistance indicates that an anti-parallel data "AP" is written into the memory cell 10. In a writing operation, the direction of the current I1 determines the data written into the memory cell 10. While the data "P" of the memory cell 10 is to be converted into the data "AP" or the data "AP" of the memory cell 10 is to be converted into the data "P", a period of time is required to convert the magnetoresistance and then change the data. Hence, the writing speed of the conventional MRAM is slower than the writing speed of DRAM, and the tCCD of MRAM is prolonged.

FIG. 3 and FIG. 4 show the reading operations of a conventional MRAM. In FIG. 3 and FIG. 4, a high reading voltage RH and a low reading voltage RL are respectively applied to the bit line BL and the source line SL of the memory cell 10, and a sensing amplifier 18 is coupled to the bit line BL. While the transistor M1 is turned on, it indicates that the memory cell 10 is selected for a reading operation. Suppose that the memory cell 10 in FIG. 3 has a first resistance and that the memory cell 10 in FIG. 4 has a second resistance. As the resistances are different, the currents flowing through the memory cell 10 are different. While detecting a current IR1, the sensing amplifier 18 determines that the memory cell 10 has the first resistance and thus outputs the parallel data "P". While detecting a current IR2, the sensing amplifier 18 determines that the memory cell 10 has the second resistance and thus outputs the anti-parallel data "AP". However, the current IR1 or IR2 of the memory cell 10 of the MRAM is very small in a reading operation. Therefore, a period of time is required to determine the magnetoresistance of the memory cell 10. Hence, the reading speed of the conventional MRAM is slower than the reading speed of DRAM, and the tCCD of MRAM is prolonged.

FIG. 5 shows a page 12 of a MRAM. The page 12 includes 8 input/output (I/O) circuits IO0, IO1, IO2, IO3, IO4, IO5, IO6, and IO7, which share a word line WL. In FIG. 5, each of the I/O circuits IO0-IO7 has 8 I/O units 122. Each I/O unit 122 has a sensing amplifier 18, which is used to read data from the memory cell 10. Therefore, each of the I/O circuits IO0-IO7 can output 8 bits of data each time.

FIG. 6 shows a conventional I/O unit 122. The conventional I/O unit 122 includes a plurality of memory cells MC1, MC2, MC3 and MC4. The memory cells MC1-MC4 are coupled to the voltage controllers 14 and 16 through switches SW1, SW2, SW3, SW4, SW5, SW6, SW7, SW8, SW10 and SW11. In a writing operation, according to an address signal (not shown in the drawing), the switches SW1-SW8 are controlled to determine the memory cell where data is to be written. For example, if the switches SW1 and SW2 are turned on, data will be written into the memory cell MC1. A bit line BL1 of the memory cell MC1 is coupled to the voltage controller 14 through the switches SW1 and SW10. A source line SL1 of the memory cell MC1 is coupled to the voltage controller 16 through the switches SW2 and SW11. If the switch SW 10 is coupled to a high voltage HV supplied by the voltage controller 14 and the switch SW11 is coupled to a low voltage LV supplied by the voltage controller 16, a data "P" will be written into the memory cell MC1. If the switch SW 10 is coupled to a low voltage LV supplied by the voltage controller 14 and the switch SW11 is coupled to a high voltage HV supplied by the voltage controller 16, a data "AP" will be written into the memory cell MC1. In a reading operation, the switch SW10 is turned off to prevent the voltage controller 14 from supplying a high voltage HV or a low voltage LV to the memory cells MC1-MC4; the switch SW11 is coupled to a low voltage LV supplied by the voltage controller 16. According to an address signal is selected the memory cell where data is to be read. For example, the switches SW1 and SW2 are turned on so as to read data from the memory cell MC1. Next, the switch SW9 is turned on to make the sensing amplifier 18 supply a voltage RH to the memory cell MC1 to generate a current. The sensing amplifier 18 detects the current to determine the resistance of the memory cell MC1 and then outputs a data D1 stored in the memory cell MC1, wherein the data D1 is the data "P" or "AP". In FIG. 6, the reading operation and the writing operation use the same low voltage LV. However, as shown in FIG. 3 and FIG. 4, in a reading operation, another low voltage RV may be applied to the source line SL1 of the memory cell MC1.

However, the I/O unit 122 of the conventional MRAM cannot undertake a reading operation and a writing operation at the same time but can only undertake either a reading operation or a writing operation singly. Further, it is unlikely for the I/O unit 122 of the conventional MRAM to write a data "P" into one memory cell (such as MC1) and write a data "AP" into another memory cell (such as MC2) at the same time. Besides, as the I/O unit 122 of the conventional MRAM has only a sensing amplifier 18, it can only read data from a single memory cell in an operation.

SUMMARY OF THE INVENTION

One objective of the present invention is to provide a magnetoresistive random access memory (MRAM) and an operating method thereof, wherein the I/O unit of the MRAM can read a memory cell and write another memory cell at the same time.

One objective of the present invention is to provide a magnetoresistive random access memory (MRAM) and an operating method thereof, wherein the I/O unit of the MRAM can write different data into different memory cells at the same time.

One objective of the present invention is to provide a magnetoresistive random access memory (MRAM) and an operating method thereof, wherein the I/O unit of the MRAM can read a plurality of memory cells at the same time.

One objective of the present invention is to provide a magnetoresistive random access memory (MRAM) and an operating method thereof, wherein the read/write column to column delay time (tCCD) of MRAM is equal to or shorter than the read/write tCCD of a dynamic random access memory (DRAM).

According to one embodiment, the magnetoresistive random access memory (MRAM) of the present invention comprises a plurality of input/output (I/O) units. In a first operating method of the MRAM, each I/O unit can read a memory cell and write another memory cell at the same time. In a second operating method of the MRAM, each I/O unit can write the same data or different data into different memory cells at the same time. In a third operating method of the MRAM, each I/O unit can read a plurality of memory cells at the same time.

As the MRAM of the present invention can read/write a plurality of memory cells at the same time, the MRAM of the present invention has shorter tCCD. Besides, the read/write tCCD of the MRAM of the present invention is equal to or shorter than the read/write tCCD of a DRAM.

DETAILED DESCRIPTION OF THE INVENTION

Figure 2:
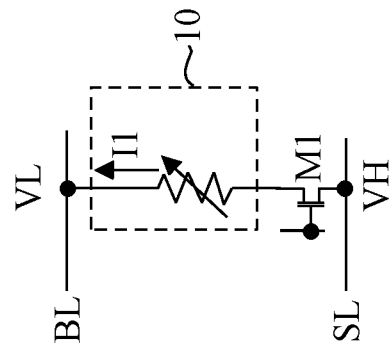
FIG. 2 shows a second writing operation of a memory cell of a conventional MRAM.
Figure 1:
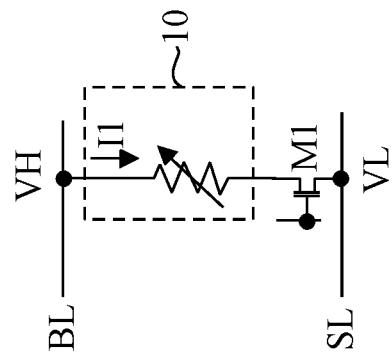
FIG. 1 shows a first writing operation of a memory cell of a conventional MRAM.
Figure 4:
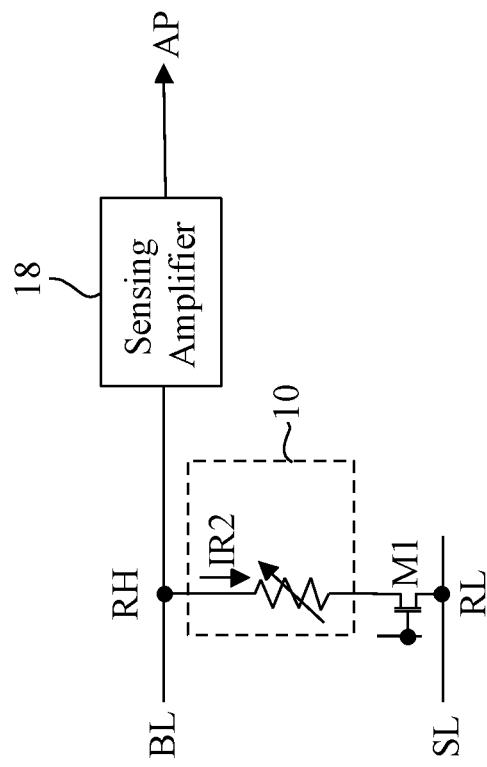
FIG. 4 shows a second reading operation of a memory cell of a conventional MRAM.
Figure 3:
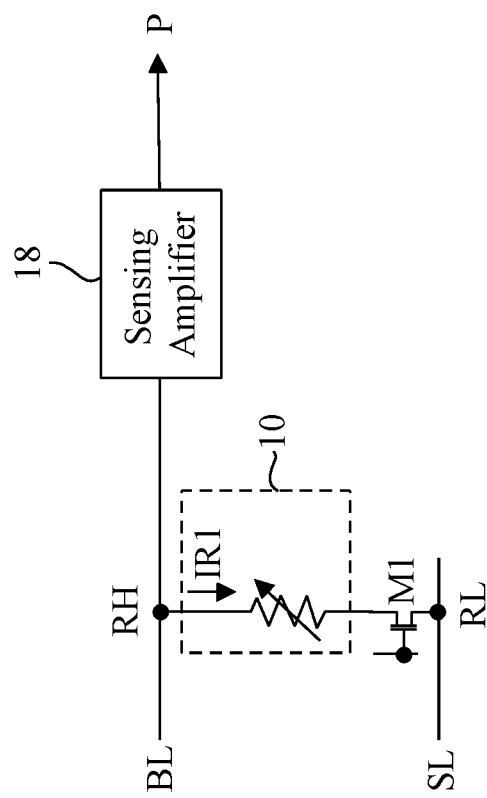
FIG. 3 shows a first reading operation of a memory cell of a conventional MRAM.
Figure 5:
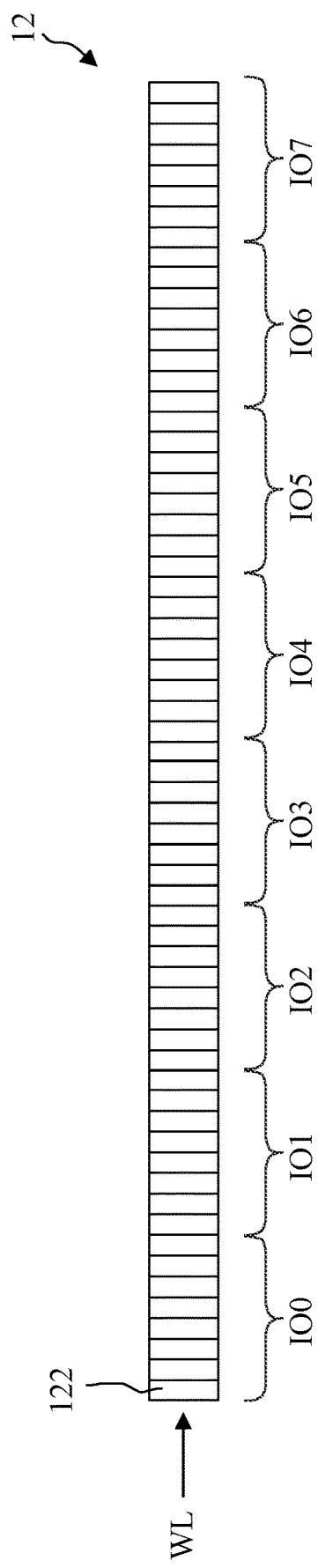
FIG. 5 shows a page of a MRAM.
Figure 6:
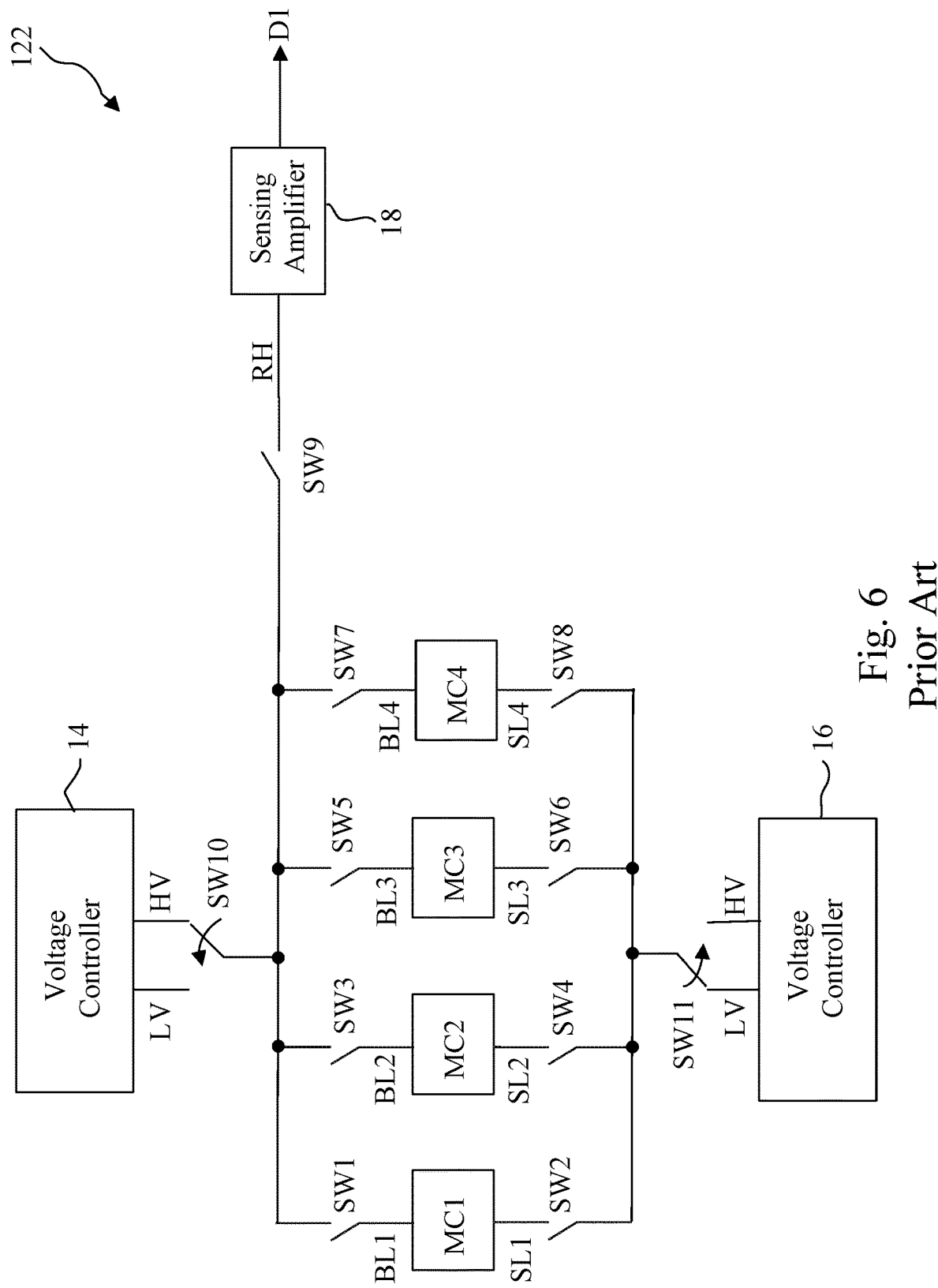
FIG. 6 shows a conventional I/O unit of a MRAM.
Figure 7:
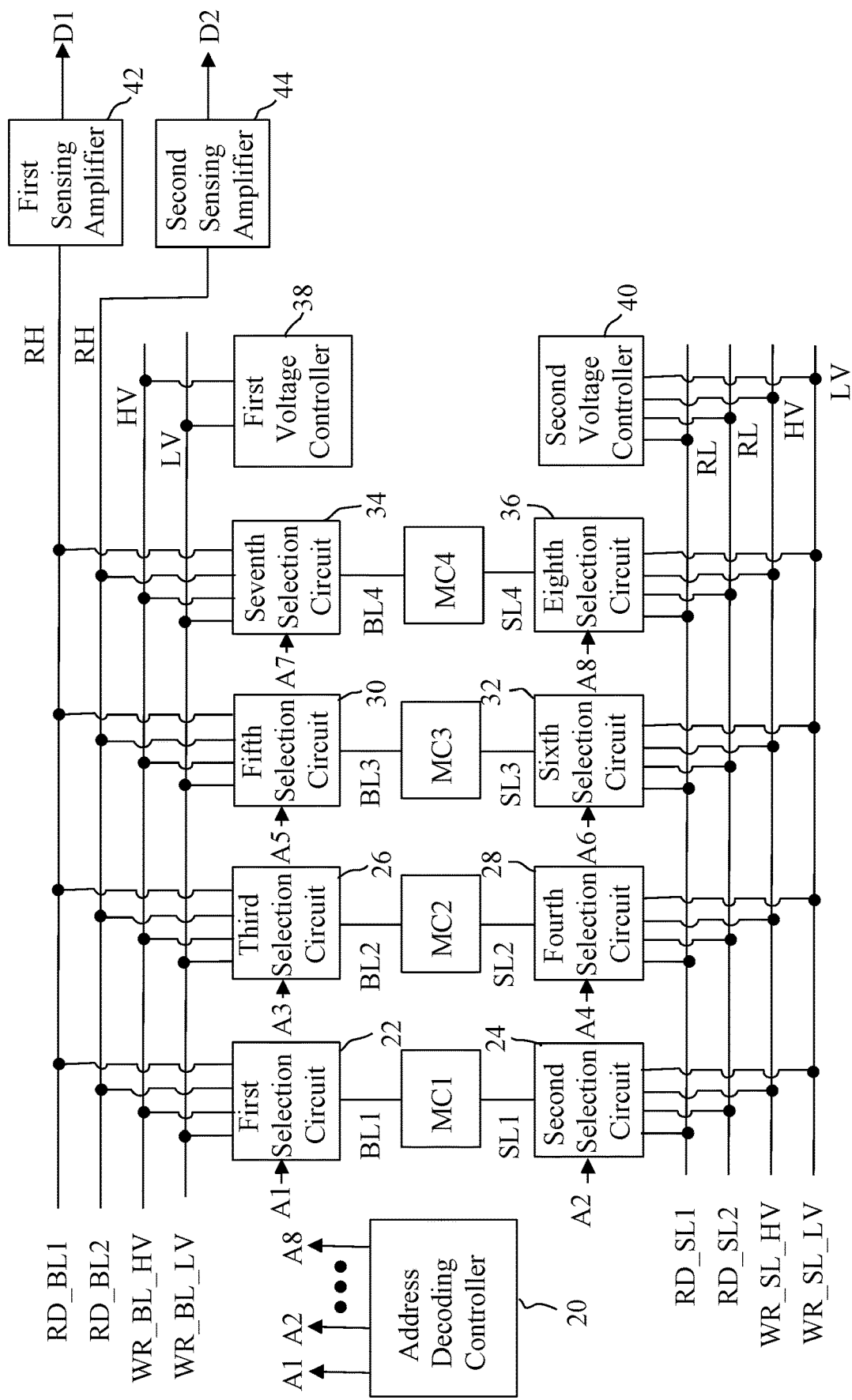
FIG. 7 schematically shows an embodiment of the I/O unit the MRAM of the present invention.
Figure 8:
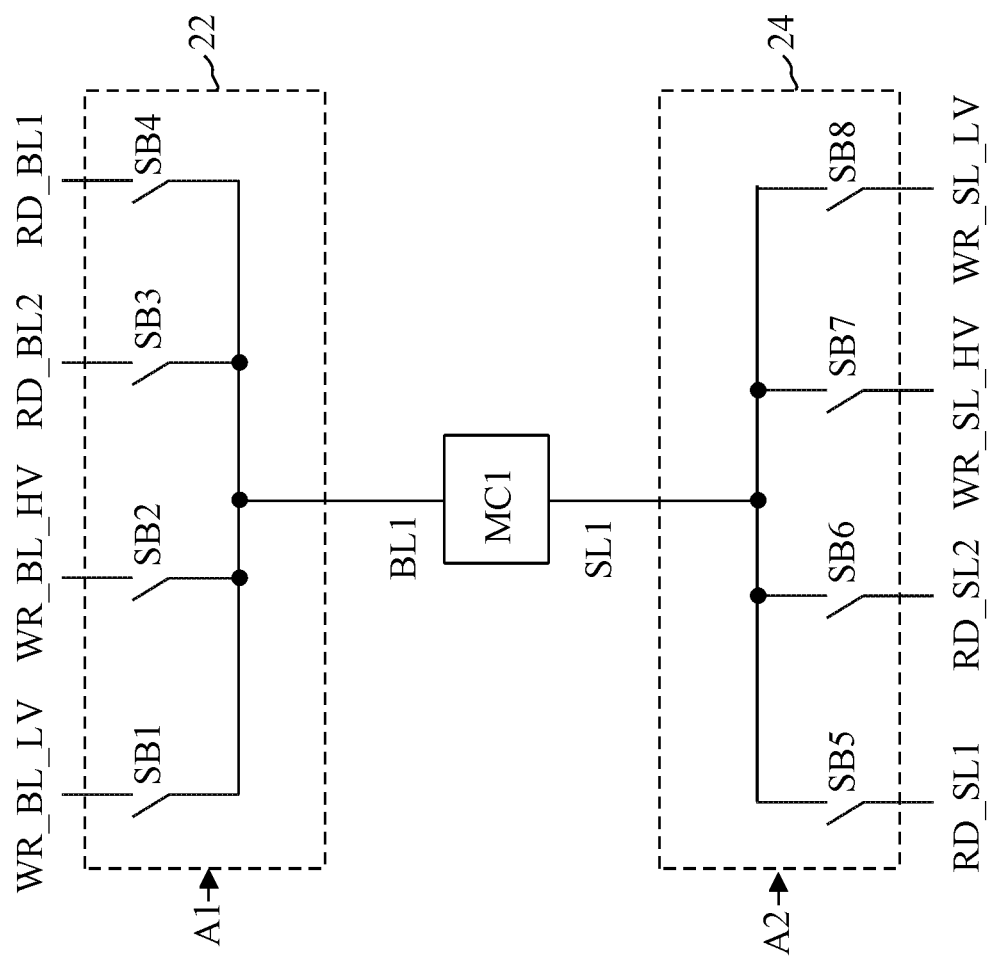
FIG. 8 schematically shows an embodiment of the first selection circuit and the second selection circuit in FIG. 7.

As shown in FIG. 5, a page of the MRAM of the present invention comprises a plurality of I/O units. FIG. 7 schematically shows an embodiment of the I/O unit of the MRAM of the present invention. In FIG. 7, the I/O unit includes 4 memory cells MC1-MC4, a first write bit line WR_BL_HV, a second write bit line WR_BL_LV, a first write source line WR_SL_LV, a second write source line WR_SL_HV, a first read bit line RD_BL1, a second read bit line RD_BL2, a first read source line RD_SL1, a second read source line RD_SL2, an address decoding controller 20, a first selection circuit 22, a second selection circuit 24, a third selection circuit 26, a fourth selection circuit 28, a fifth selection circuit 30, a sixth selection circuit 32, a seventh selection circuit 34, an eighth selection circuit 36, a first voltage controller 38, a second voltage controller 40, a first sensing amplifier 42, and a second sensing amplifier 44. The first voltage controller 38 supplies a first signal HV to the first write bit line WR_BL_HV and supplies a second signal LV to the second write bit line WR_BL_LV. The first sensing amplifier 42 supplies a third signal RH to the first read bit line RD_BL1. The second sensing amplifier 44 supplies the third signal RH to the second read bit line RD_BL2. The second voltage controller 40 supplies the first signal HV to the second write source line WR_SL_HV, supplies the second signal LV to the first write source line WR_SL_LV, and supplies a fourth signal RL to the first read source line RD_SL1 and the second read source line RD_SL2. In the embodiment shown in FIG. 7, the first signal HV is a first high voltage; the second signal LV is a first low voltage; the third signal RH is a second high voltage; the fourth signal RL is a second low voltage. The difference between the first high voltage and the first low voltage is larger than the difference between the second high voltage and the second low voltage. FIG. 8 schematically shows an embodiment of the first selection circuit 22 and the second selection circuit 24 in FIG. 7. The first selection circuit 22 includes 4 switches SB1, SB2, SB3 and SB4, which are used to couple a first bit line BL1 of the first memory cell MC1 to one of the second write bit line WR_BL_LV, the first write bit line WR_BL_HV, the second read bit line RD_BL2, and the first read bit line RD_BL1. The second selection circuit 24 includes 4 switches SB5, SB6, SB7 and SB8, which are used to couple a first source line SL1 of the first memory cell MC1 to one of the first read source line RD_SL1, the second read source line RD_SL2, the second write source line WR_SL_HV, and the first write source line WR_SL_LV. The architectures of the third selection circuit 26 to the eighth selection circuit 36 are similar to the architectures of the first selection circuit 22 and the second selection circuit 24 and will not repeat herein. In the embodiment shown in FIG. 7, the I/O unit has 4 memory cells MC1-MC4. However, the present invention is not limited by the embodiment. The number of the memory cells may be varied according to requirement.

The I/O unit of the MRAM of the present invention can read and write at the same time. Let the memory cells MC1 and MC2 in FIG. 7 be exemplifications. Suppose that the address decoding controller 20 sends out address signals A1 and A2 to select an operation of reading the memory cell MC1 and sends out address signals A3 and A4 to select an operation of writing the memory cell MC2. According to the address signal A1, the first selection circuit 22 couples the first bit line BL1 of the memory cell MC1 to the first read bit line RD_BL1. According to the address signal A2, the second selection circuit 24 couples the first source line SL1 of the memory cell MC1 to the first read source line RD_SL1. The first sensing amplifier 42 senses and outputs the data of the first memory cell MC1. At the same time, according to the address signals A3 and A4, the third selection circuit 26 and the fourth selection circuit 28 respectively couple a second bit line BL2 and a second source line SL2 of the second memory MC2 to the first write bit line WR_BL_HV and the first write source line WR_SL_LV so as to write a data "P" into the second memory cell MC2. Alternatively, the third selection circuit 26 and the fourth selection circuit 28 respectively couple the second bit line BL2 and the second source line SL2 of the second memory MC2 to the second write bit line WR_BL_LV and the second write source line WR_SL_HV so as to write a data "AP" into the second memory cell MC2. Herein, the case of simultaneously reading/writing two memory cells MC1 and MC2 is used as an exemplification. However, the present invention is not limited by the case. In another embodiment of the present invention, while the first memory cell MC1 is read and the second memory cell MC2 is written, the fifth selection circuit 30 and the sixth selection circuit 32 are controlled to respectively couple a third bit line BL3 and a third source line SL3 of the third memory cell MC3 to the second read bit line RD_BL2 and the second read source line RD_SL2, whereby the second sensing amplifier 44 senses and outputs the data of the third memory cell MC3. In yet another embodiment of the present invention, while the first memory cell MC1 is read and the second memory cell MC2 is written, the seventh selection circuit 34 and the eighth selection circuit 36 are controlled to respectively couple a fourth bit line BL4 and a fourth source line SL4 of the fourth memory cell MC4 to the first write bit line WR_BL_HV and the first write source line WR_SL_LV, whereby to write a data "P" into the fourth memory cell MC4.

The I/O unit of the MRAM of the present invention can write identical or different data into different memory cells at the same time. The memory cells MC1 and MC2 in FIG. 7 are used to exemplify two different memory cells. While the first selection circuit 22 and the second selection circuit 24 respectively couple the first bit line BL1 and the first source line SL1 of the first memory cell MC1 to the first write bit line WR_BL_HV and the first write source line WR_SL_LV according to the address signals A1 and A2 so as to write a data "P" into the first memory cell MC1, the third selection circuit 26 and the fourth selection circuit 28 respectively couple the second bit line BL2 and the second source line SL2 of the second memory MC2 to the second write bit line WR_BL_LV and the second write source line WR_SL_HV according to the address signals A3 and A4 so as to write a data "AP" into the second memory cell MC2. Alternatively, according to the address signals A3 and A4, the third selection circuit 26 and the fourth selection circuit 28 respectively couple the second bit line BL2 and the second source line SL2 of the second memory MC2 to the first write bit line WR_BL_HV and the first write source line WR_SL_LV so as to write a data "P" into the second memory cell MC2.

The I/O unit of the MRAM of the present invention can read data from two memory cells at the same time. The memory cells MC1 and MC2 in FIG. 7 are used to exemplify two different memory cells. While the first selection circuit 22 and the second selection circuit 24 respectively couple the first bit line BL1 and the first source line SL1 of the first memory cell MC1 to the first read bit line RD_BL1 and the first read source line RD_SL1 according to the address signals A1 and A2, the third selection circuit 26 and the fourth selection circuit 28 respectively couple the second bit line BL2 and the second source line SL2 of the second memory MC2 to the second read bit line RD_BL2 and the second read source line RD_SL2 according to the address signals A3 and A4. Consequently, the first sensing amplifier 42 and the second sensing amplifier 44 can respectively sense and output the data of the first memory cell MC1 and the data of the second memory cell MC2. In the embodiment shown in FIG. 7, at most two memory cells can be read at the same time. However, the present invention is not limited by the embodiment. If an additional sensing amplifier and an additional set of the read bit line and the read source line are added to the circuit, three memory cells can be read at the same time.

As the I/O unit of the MRAM of the present invention can read/write a plurality of memory cells at the same time, the read/write tCCD of the MRAM of the present invention is equal to the read/write tCCD of a DRAM, or even shorter than the tCCD of a DRAM. Suppose that a DRAM spends 5 ns on reading a memory cell and that the MRAM of the present invention spends 10 ns on reading a memory cell. The DRAM can only read a memory cell each time. In the DRAM, the operation of reading the second memory cell and the operation of reading the first memory cell is separated by 5 ns; the operation of reading the third memory cell and the operation of reading the second memory cell is also separated by 5 ns. In the conventional MRAM, the operation of reading the second memory cell and the operation of reading the first memory cell is separated by 10 ns; the operation of reading the third memory cell and the operation of reading the second memory cell is also separated by 10 ns. However, the I/O unit of the MRAM of the present invention can read/write a plurality of memory cells at the same time. Thus, in the MRAM of the present invention, the operation of reading the second memory cell and the operation of reading the first memory cell is separated by less than 10 ns. In the MRAM of the present invention, the time interval can be 5 ns or less than 5 ns. Therefore, the tCCD of the MRAM of the present invention is equal to the tCCD of a DRAM, or even shorter than the tCCD of a DRAM. Hence, the MRAM of the present invention has a data rate identical to or faster than the data rate of a DRAM.

The embodiments have been described above to demonstrate the principles of the present invention and enable the persons skilled in the art to understand, make, and use the present invention. However, these embodiments are only to exemplify the present invention but not to limit the scope of the present invention. The technical thought and scope of the present invention is defined by the claims stated below and the equivalents thereof. Any modification or variation according to the principle, spirit or embodiment of the present invention is to be also included by the scope of the present invention.

What is claimed is:

1. A magnetoresistive random access memory, comprising:
   a plurality of input/output units, wherein each of said input/output units includes:
      a first memory cell, having a first bit line, and a first source line;
      a second memory cell, having a second bit line, and a second source line;
      a first write bit line, configured to receive a first signal;
      a second write bit line, configured to receive a second signal;
      a first write source line, configured to receive said second signal;
      a second write source line, configured to receive said first signal;
      a first read bit line, configured to receive a third signal;
      a second read bit line, configured to receive said third signal;
      a first read source line, configured to receive a fourth signal;
      a second read source line, configured to receive said fourth signal;
      a first selection circuit, coupled to said first bit line, said first read bit line, said second read bit line, said first write bit line, and said second write bit line, and configured to couple said first bit line to one of said first read bit line, said second read bit line, said first write bit line, and said second write bit line;

a second selection circuit, coupled to said first source line, said first read source line, said second read source line, said first write source line, and said second write source line, and configured to couple said first source line to one of said first read source line, said second read source line, said first write source line, and said second write source line;

a third selection circuit, coupled to said second bit line, said first read bit line, said second read bit line, said first write bit line, and said second write bit line, and configured to couple said second bit line to one of said first read bit line, said second read bit line, said first write bit line, and said second write bit line;

a fourth selection circuit, coupled to said second source line, said first read source line, said second read source line, said first write source line, and said second write source line, and configured to couple said second source line to one of said first read source line, said second read source line, said first write source line, and said second write source line;

a first sensing amplifier, coupled to said first read bit line, and configured to read data from said first memory cell or said second memory cell; and a second sensing amplifier, coupled to said first read bit line, and configured to read data from said first memory cell or said second memory cell.

2. The magnetoresistive random access memory according to claim 1, wherein while said first selection circuit couples said first bit line to said first read bit line or said second read bit line and said second selection circuit couples said first source line to said first read source line or said second read source line, said third selection circuit and said fourth selection circuit respectively couple said second bit line and said second source line to said first write bit line and said first write source line, or said third selection circuit and said fourth selection circuit respectively couple said second bit line and said second source line to said second write bit line and said second write source line.

3. The magnetoresistive random access memory according to claim 1, wherein while said first selection circuit and said second selection circuit respectively couple said first bit line and said first source line to said first write bit line and said first write source line, said third selection circuit and said fourth selection circuit respectively couple said second bit line and said second source line to said second write bit line and said second write source line.

4. The magnetoresistive random access memory according to claim 1, wherein while said first selection circuit and said second selection circuit respectively couple said first bit line and said first source line to said first write bit line and said first write source line, said third selection circuit and said fourth selection circuit respectively couple said second bit line and said second source line to said first write bit line and said first write source line.

5. The magnetoresistive random access memory according to claim 1, wherein while said first selection circuit and said second selection circuit respectively couple said first bit line and said first source line to said first read bit line and said first read source line, said third selection circuit and said fourth selection circuit respectively couple said second bit line and said second source line to said second read bit line and said second read source line.

* * * * *